United States Patent [19]

Wheatley, Jr.

[11] 3,815,037

[45] June 4, 1974

[54] CURRENT TRANSLATING CIRCUITS

[75] Inventor: Carl Franklin Wheatley, Jr., Somerset, N.J.

[73] Assignee: RCA Corporation, New York, N.Y.

[22] Filed: Nov. 24, 1972

[21] Appl. No.: 309,025

Related U.S. Application Data

[63] Continuation of Ser. No. 56,534, July 20, 1970, abandoned.

[52] U.S. Cl. .................... 330/19, 330/17, 330/30 D

[51] Int. Cl. .............................................. H03f 3/42

[58] Field of Search .......... 307/303; 330/13, 17, 19, 330/30 D, 38 M, 69

[56] References Cited

UNITED STATES PATENTS

| | | | |
|---|---|---|---|
| 3,416,092 | 12/1968 | Frederiksen | 330/38 M X |
| 3,660,773 | 5/1972 | Free | 330/38 M X |

FOREIGN PATENTS OR APPLICATIONS

| | | | |
|---|---|---|---|
| 641,499 | 5/1962 | Canada | 307/303 X |

*Primary Examiner*—Herman Karl Saalbach
*Assistant Examiner*—Lawrence J. Dahl

[57] ABSTRACT

An amplifier suitable for integrated circuit construction including an active device current repeater load arrangement having relatively high output impedance, good frequency response, temperature stability and signal handling capabilities. The current repeater load arrangement includes a diode connected transistor and a further transistor having proportionally related conduction characteristics. A current amplifier comprising cascaded transistors is connected between the collector of the further transistor and the bases of the further transistor and the diode connected transistor. An additional, unidirectionally conducting device, poled to conduct as the first one of the cascaded transistors ceases conduction, is coupled from the collector of the further transistor to the input of one of the cascaded transistors following the first.

15 Claims, 2 Drawing Figures

Figure 1:
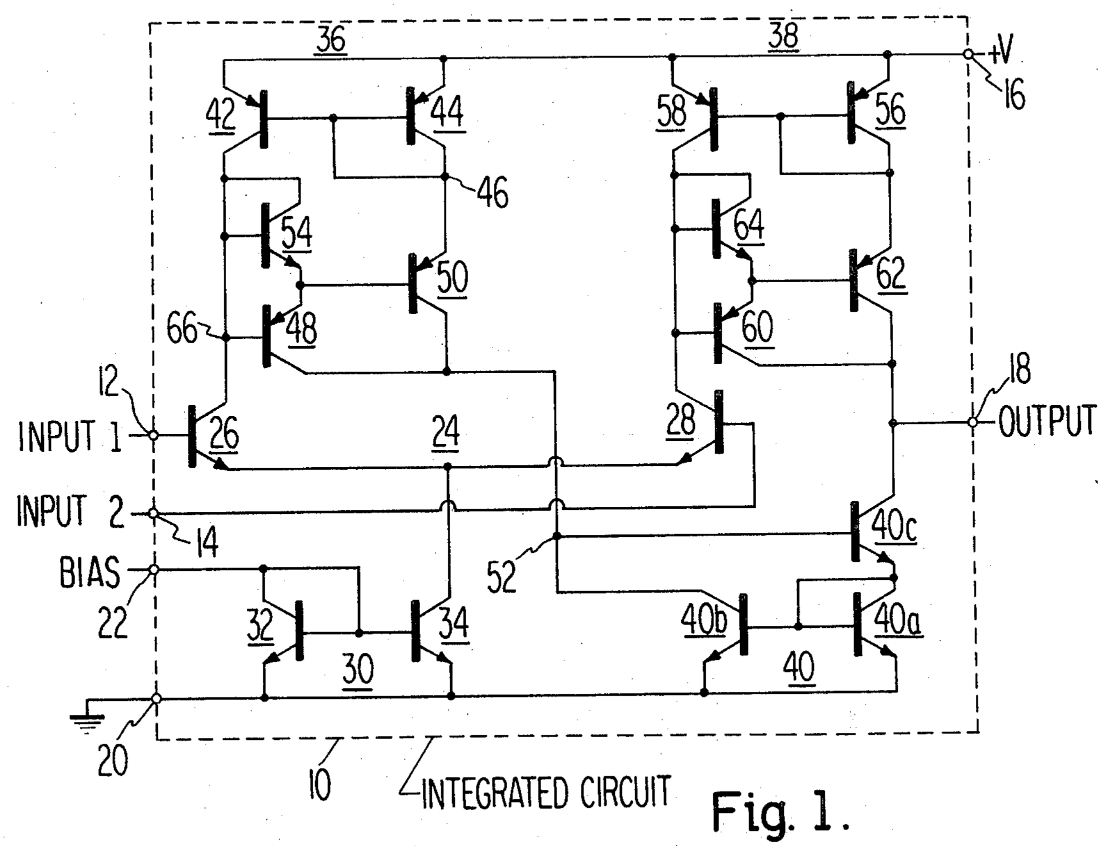

INVENTOR.
Carl F. Wheatley, Jr.
BY
Kenneth R. Schaefer
ATTORNEY

CURRENT TRANSLATING CIRCUITS

This is a continuation of application Ser. No. 56,534, filed July 20, 1970, now abandoned.

This invention relates to electrical current translating or repeating circuits and, in particular, to current repeater circuits useful, for example, as active load devices or voltage level shifting circuits in the integrated circuit art.

As used herein the term current repeater refers to a circuit arrangement to which an input current is supplied and from which an output current is obtained which is directly porportional to the input current. While such an arrangement has general application, it is particularly realizable and therefore is widely used in integrated circuits. Examples of types and uses of current repeaters adapted for construction in integrated circuit form are shown in my earlier filed United States Patent Applications Ser. No. 837,382, filed in the United States June 30, 1969; Ser. No. 847,879, filed in the United States Aug. 6, 1969; and Ser. No. 869,708, filed in the United States Oct. 27, 1969, all of which are assigned to the same assignee as the present invention.

Other descriptions of current repeaters particularly useful in integrated circuitry are contained in the technical literature (see for example, "Digest of Technical Papers" presented at the I.E.E.E. International Solid State Circuit Conferences of 1968 and 1969, published by Lewis Winner, New York, New York.) Most of the current repeaters described in the above-referenced material make use of a configuration including at least two transistors which in the simplest case, are substantially identical. The two devices are maintained in the same thermal environment by virture of being located near each other on a single integrated circuit chip. The desired current repeater operation is obtained by connecting the base-emitter circuits of the two transistors in parallel and by directly connecting the collector of one of the transistors to the junction of the connected bases. The one transistor provides diode-like operation and serves as the input device while the other transistor provides the desired output current at its collector. This configuration may be modified to provide substantially fixed current gain (or attenuation) by fabricating the two transistors with different base-emitter junction areas. The gain then is determined substantially by the ratio of the base-emitter area of the output transistor to the base-emitter area of the input device. In such a repeater arrangement, the current gain is, for low values of $\beta$ (base-collector current gain of the individual transistors,) dependent upon that parameter. Since the $\beta$ of a transistor is temperature dependent, the gain of such a repeater is therefore also temperature dependent. These repeaters also exhibit a relatively low output impedance and their gain is therefore subject to variations as supply voltage varies.

In many uses of current repeaters, it is desirable to provide an output impedance greater than that which can be obtained with the two device configuration so as to minimize the effect of supply voltage changes. It is desirable, however, to obtain the increased output impedance without substantial degradation of other operating characteristics such as frequency response, low current level handling capabilities and temperatue range operation of the repeater.

In accordance with the present invention, an increase is obtained in the output impedance of a current repeater substantially without degrading its high frequency, low signal level or temperature range performance by coupling a cascade of current gain transistors (e.g. a Darlington amplifier) from the collector of the transistor device to the base of the diode-connected transistor device of a current repeater arrangement. Input current is supplied to the junction of that collector and the input terminal of the cascaded transistors. Output current is obtained from the collector of at least one of the current gain transistors, the emitter of which is directly connected to the diode base. A substantially unidirectionally conductive device is coupled between the input terminal of the cascaded transistors and the base of the one of the cascaded transistors coupled in the output current path of the repeater to insure rapid response of the one of the cascaded transistors.

Figure 2:
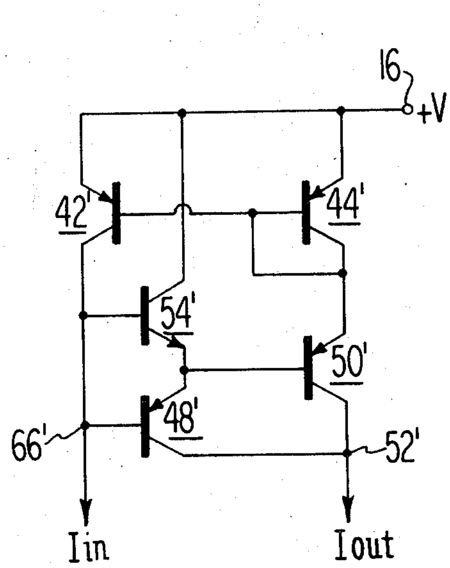

The novel features that are considered characteristic of this invention are set forth in the appended claims. The invention, itself, however, both as to its organization and method of operation, as well as additional objects will best be understood from the following description when read in connection with the accompanying drawing, in which:

FIG. 1 illustrates, in schematic circuit diagram form, an operational amplifier suitable for construction on a single integrated circuit chip which employs a current repeater arrangement constructed in accordance with the present invention; and FIG. 2 illustrates, in schematic circuit diagram form, an alternate arrangement for a current repeater constructed in accordance with the present invention.

Referring to FIG. 1, all of the components enclosed within the dashed line rectangle are fabricated on a single integrated circuit chip 10.

The integrated circuit chip 10 is provided with a first input terminal 12, a second input terminal 14, a direct operating voltage (+V) source terminal 16, an output terminal 18, a reference voltage (ground) terminal 20, and an external bias supply terminal 22. Input signal terminals 12 and 14 are coupled to a differential amplifier arrangement 24 comprising a pair of emitter-coupled NPN transistors 26 and 28. An NPN transistor current supply 30 supplies operating current to transistors 26 and 28 according to the current level supplied at bias terminal 22. Current supply 30 comprises a conventional current repeater including a diode-connected input transistor 32 and an output transistor 34. The base-emitter circuits of transistors 32 and 34 are connected in parallel between the bias input terminal 22 and the reference voltage terminal 20. Transistors 32 and 34 are substantially identical and provide a current gain of unity for the bias current supplied at terminal 22.

Active load circuits or current repeaters 36 and 38, constructed in accordance with the present invention, are coupled from the collectors of transistors 26 and 28 to the operating voltage (+V) terminal 16. Details of current repeaters 36 and 38 will be set forth below. Output currents from load circuits 36 and 38 are combined in a conventional level shifting and signal combining diode-transistor current repeater combination 40 which is returned to the reference potential terminal 20. Diode-transistor combination 40 serves to combine currents from load devices 36 and 38 and to couple a resultant single-ended output signal to output terminal 18 as will be explained more fully below. Diode-transistor combination 40 comprises a diode-connected NPN transistor 40*a*, a substantially identical transistor 40*b* having its base-emitter junction coupled in parallel with that of transistor 40*a* and a feedback NPN transistor 40*c* having an input (base-emitter) circuit coupled from the collector of transistor 40*b* to the bases of transistors 40*a* and 40*b*. An output (emitter-collector) circuit of transistor 40*c* is coupled to output terminal 18.

The details of current repeaters 36 and 38 will now be set forth. Current repeater 36 comprises first and second PNP transistors 42 and 44 having their base-emitter junctions coupled in parallel and their emitter electrodes returned to a reference or supply potential (+V) at terminal 16. The joined base electrodes of transistors 42 and 44 are also directly connected to the collector electrode of transistor 44 at circuit junction 46. Transistors 42 and 44 have proportionally related conduction characteristics and, for purposes of explanation, they will be assumed to be substantially identical in base-emitter junction geometries. In that case, repeater 36 provides substantially unity current gain. It should be recognized that the base-emitter junction of transistor 44 may be larger or smaller than the base-emitter junction of transistor 42, thereby providing corresponding current gain greater or less than unity. Alternatively, additional like diode-connected transistors may be coupled in parallel with transistor 44 to provide current gain greater than unity or like transistors may be coupled in parallel with transistor 42 to provide current gain less than unity. Preferably, transistors 42 and 44 also are maintained in substantially the same thermal environment by, for example, placing such transistors in relatively close proximity on the single integrated circuit chip 10.

Current amplifying means comprising cascaded PNP emitter follower transistors 48 and 50 are coupled in a feed-back arrangement from the joined collector electrodes of transistors 26 and 42 to circuit junction 46. Transistors 48 and 50 are arranged in a Darlington amplifier configuration with the base (input) of transistor 48 connected to the joined collectors of transistors 26 and 42 and the emitter of transistor 50 connected to circuit junction 46. The collectors of transistors 48 and 50, at which output current is produced, are connected to an input terminal 52 of diode-transistor combination 40.

A substantially unidirectionally conductive device comprising the base-emitter junction of an NPN transistor 54 is coupled from the base of transistor 48 to the base of transistor 50. The collector of transistor 54 is shorted to its base. The base-emitter of transistor 54 is poled for conduction of current from the joined collectors of transistors 26 and 42 in the reverse direction through the base-collector junction of transistor 50.

Current repeater 38 is substantially identical to current repeater 36 and includes diode-connected PNP transistor 56, PNP transistor 58, Darlington coupled PNP transistors 60 and 62 and diode-connected NPN transistor 64. The joined collector electrodes of transistors 60 and 62, at which output current is produced, are connected to output terminal 18.

In the operation of the amplifier shown in FIG. 1, direct operating current is supplied via terminal 22 to current source 30. When no input signals are supplied, this operating current is divided substantially equally between transistors 26 and 28. Substantially all of the quiescent operating direct current provided at the collector of transistor 26 is returned to the operating voltage supply (+V) via the collector-emitter path of transistor 42 of load circuit 36. A relatively small current also is supplied to the base of transistor 48, which, in turn, couples an amplified current to transistor 50. Transistor 50 couples amplified direct current to the joined bases of diode 44 and transistor 42. Sufficient current is supplied to the bases of transistors 42 and 44 so that the quiescent collector current of transistor 42 is approximately equal to the quiescent collector current of transistor 26 (i.e., the sum of the currents at circuit junction 66 is zero.) For the condition where transistors 42 and 44 are substantially identical, the output current provided at the joined collector electrodes of transistor 48 and transistor 50 is approximately equal to the collector current of transistor 26. Similarly, quiescent collector current of transistor 28 is approximately equal to the quiescent output current of the combination of transistors 60 and 62. Where the devices 40*a* and 40*b* of level translating stage 40 are essentially identical (unity gain), the quiescent collector current of transistor 40*c* is substantially equal to the sum of quiescent collector currents of transistors 60 and 62 so that there is zero quiescent output current at terminal 18.

When signals are applied to either or both of input terminals 12 and 14, these signals are amplified by transistors 26 and 28. Differentially related amplified signals are coupled, respectively, by Darlington amplifiers 48, 50 and 60, 62 to the joined bases of transistors 42, 44 and transistors 56, 58. The collector currents of transistors 42 and 58 change accordingly as do the collector (output) currents of the Darlington amplifiers 48, 50 and 60, 62. The output signals of transistors 48, 50 are coupled to level translating repeater stage 40 and are combined with the output signals of transistors 60, 62 so as to provide a single-ended output signal at terminal 18. Variations in the supply voltage (+V) coupled to terminal 16 have negligible effect on the operation of the circuit and, particularly, upon the operation of the current repeater loads 36 and 38. That is, considering current repeater load 36, the supply voltage (+V) is applied across the series combination of the emitter-base of transistor 44, the emitter-collector of transistor 50, the base-emitter of transistor 40*c* and the parallel connected base-emitters of transistors 40*a* and 40*b*. Since the base-emitter voltages of transistors 44, 40*a*, 40*c* are substantially constant, variations in the supply voltage appear across the collector-emitter of transistor 50. Since transistor 48 is coupled to transistor 50 in a Darlington configuration, the effective collector-emitter impedance of the transistors 48, 50 is greater than that of transistor 50 alone and is sufficient that changes in the collector-emitter voltage have negligible effect on the $\alpha$ (common base current gain) of the configuration. Moreover, such slight changes in $\alpha$ of transistors 48 and 50 which do occur are of very minor significance from the point of view of the overall gain of the current repeaters 36 and 38. These arrangements therefore provide the desired high output impedance.

The operation of the transistors 54 and 64 will now be explained. When the input signal supplied, for example, to terminal 12 decreases sufficiently from its quiescent level, the collector current of transistor 26 decreases so as to cut off input transistor 48 of the Darlington connected pair 48, 50. In the absence of transistor 54, when input transistor 48 turns off, transistor 50 continues to conduct due to charge stored in its base-emitter as well as due to the presence of low level leakage current. The stored charge current and leakage current are reflected in the output produced at terminal 18 as an apparent signal. Transistor 48 does not provide a path for removal of such stored charge.

As temperature increases, the leakage current of transistor 50 increases and therefore, the error produced in the output signal at terminal 18 would be temperature dependent.

Transistor 54, however, is poled to conduct for signals of a polarity which drive transistor 48 to cut off. When transistor 54 conducts, it serves to remove charge stored in the base emitter junction of transistor 50 and to provide a by-pass for leakage current thereby turning off transistor 50 and the entire Darlington stage 48 in a relatively rapid manner.

The frequency response of the current repeaters 36 and 38, as well as the effects of temperature on such response, are therefore improved by operation of transistors 54 and 64.

It has previously been stated that the ratio between the collector current of transistor 26 (input to repeater 36) and the combined collector currents of transistors 48 and 50 (output of repeater 36) is substantially unity where transistors 42 and 44 are essentially identical and operate in the same environment. Analysis of the circuit configuration demonstrates that this ratio is dependent to some extent upon the $\beta$ of the included PNP transistors (or their equivalents.) In fact, the effective current gain of the repeater 36 (or 38) increases above unity as the $\beta$ of the PNP transistors 42, 44, 48, 50 decreases. In the illustrated embodiment, this fact tends to make the overall gain of the amplifier 24 relatively constant for different operating current levels since the current gain of the transistors in the amplifier 24 decreases as operating current level decreases. The decreased current gain of the NPN transistor and the increased current gain of the current repeaters tend to offset one another to provide an overall amplifier gain which is relatively constant for a wide range of operating currents.

Referring to FIG. 2, an alternative embodiment of the invention is shown wherein the unidirectionally conductive device for permitting rapid turnoff of transistor 50′ comprises an NPN transistor 54′. Transistor 54′ is similar to transistor 54 but the collector of transistor 54′ is returned to the terminal 16. Transistor 54′ therefore can provide increased gain and somewhat faster switching than transistor 54.

While the invention has been described in terms of a preferred embodiment, various modifications may be made within the scope of the invention. For example, a unidirectionally conductive device other than a transistor may be used in place of the transistor 54. Furthermore, additional biasing components such as one or more diodes may be associated with transistors 48 and/or 54 to further improve the switching of transistor 50. Devices other than the particular types of transistors may also be utilized.

What is claimed is:

1. In a current repeater which includes first and second transistors, each with emitter, collector and base electrodes, a direct connection between said two emitter electrodes and a common connection, a direct connection between said two base electrodes and the collector electrode of one of said transistors, a direct current coupling from one of said collector electrodes to a first circuit point adapted to receive an input current from an external source, and a direct current coupling from the other of said collector electrodes to a second circuit point, a circuit for coupling said second circuit point to a third circuit point comprising:

a third and fourth transistors, each having a base and an emitter electrodes with a base-emitter semiconductor junction therebetween, and each having a collector electrode, said fourth transistor collector electrode being direct current conductively coupled to said third circuit point and said fourth transistor emitter electrode being direct current conductively coupled to said second circuit point;

means for direct coupling said first circuit point to said third transistor base electrode, said third transistor producing amplified emitter current in response to base current flowing therein;

means for direct coupling said third transistor emitter electrode to said fourth transistor base electrode; and means coupled to the base-emitter junction of said fourth transistor for removing stored charge from said fourth transistor base-emitter junction when said third transistor base-emitter junction is rendered non-conductive by variations of said input current.

2. In a current repeater as set forth in claim 1, said means for removing stored charge comprising:

a device providing a controlled conductivity path between said first circuit point and said fourth transistor base electrode, controlled in response to said input current variations.

3. In a current repeater as claimed in claim 2 said device comprising a substantially unidirectional conductive semiconductor device.

4. In a current repeater as claimed in claim 2, said means for removing stored charge comprising:

a fifth transistor having a base and an emitter electrodes with a base-emitter junction therebetween, having a collector electrode to which its said base electrode is direct coupled, and providing between its collector and emitter electrodes said controlled conductivity path.

5. In a current repeater as claimed in claim 1, said means for removing stored charge comprising:

a fifth transistor of a complementary conductivity type to said first, second, third and fourth transistors, having a base electrode direct coupled to said first circuit point, having an emitter electrode direct coupled to said third transistor emitter electrode and having a collector electrode direct coupled to said common connection.

6. In a current repeater as claimed in claim 1, said third transistor being directly coupled at its collector electrode to said third circuit point.

7. A circuit for increasing the output impedance of a current repeater of the type which includes first and second transistors, said first and said second transistors being connected base-to-base and having their emitter electrodes each connected to a point of reference voltage, said first transistor connected at its collector to a first circuit point to which a current from an external source may be applied and said second transistor connected at its collector to said base-to-base connection and to a second circuit point comprising:

third and fourth transistors, each having base, emitter and collector electrodes, the emitter of the third direct current connected to the base of the fourth, the emitter of the fourth direct current connected to said second circuit point, the base of the third direct current connected to said first circuit point, and the collectors of said third and fourth transistors connected to a third circuit point to which a circuit to be driven may be connected.

8. A circuit as set forth in claim 7, further including means connected to the base-emitter circuit of said fourth transistor for discharging charge carriers which tend to accumulate in this circuit when said third transistor is driven to cut-off in response to current variation at said first terminal.

9. A circuit as set forth in claim 8, wherein said means for discharging comprises diode means connected between the base of said fourth transistor and said other of said circuit points.

10. A circuit as set forth in claim 9, wherein said diode means comprises a diode connected transistor of opposite conductivity type to the third and fourth transistors.

11. The combination of:

first and second current repeaters, each of the type which includes first and second transistors connected base-to-base, to the collector of said second transistor, and connected emitter-to-emitter;

a connection from a terminal to which current from an external source may be applied connected to the collector of the first transistor of said first repeater;

a connection from a point of operating voltage to said emitter-to-emitter connection of said first repeater;

a connection from a point of reference voltage to said emitter-to-emitter connection of said second repeater; and a transistorized current amplifier means connected between the base-to-base connection of said first repeater and the collector of the first transistor of the second repeater, said amplifier means together with said first repeater exhibiting a composite gain of somewhat greater than one and which increases as $\beta$, the base-collector gain of the transistors of said first repeater and said amplifier means decreases, and said second repeater exhibiting a gain of somewhat less than one and which decreases as the $\beta$ of its transistors decreases.

12. The combination as set forth in claim 11, wherein said current amplifier means comprises a Darlington pair connected at its base input terminal to said terminal for said external source, connected at its emitter input terminal to said base-to-base connection of said first repeater and connected at its collector-to-collector connection to said second repeater.

13. In a current repeater of the type which includes a first circuit point to which current from an external source may be applied, a second circuit point for application of a referecne voltage and a third circuit point for connection to a load, a first and a second and a third transistors of the same conductivity type each of which has a base and an emitter and a collector electrodes, means for connecting said first transistor collector electrode to said first circuit points, means for connecting each of the emitter electrodes of said first and said second transistors to said second circuit point, means for connecting each of the base electrodes of said first and said second transistors and said second transistor collector electrode to said third transistor emitter electrode, means for connecting said third transistor collector electrode to said third circuit point and means for connecting said first circuit point to said third transistor base electrode, an improvement to cause the current gain of said current repeater to increase as $\beta$ the common-emitter forward current gains of said first and said second transistors increases, said increase being of the order of 2 parts in $\beta$ parts, wherein said means for connecting said first circuit point to said third transistor base electrode includes:

a fourth transistor having a control electrode connected to said first circuit point and having a principal conductivity path connecting said third transistor base electrode and said third circuit point.

14. The improvement of claim 13 wherein said fourth transistor has a base electrode corresponding to its said control electrode and a collector-to-emitter path corresponding to its principal conductivity path.

15. The improvement of claim 14 wherein said fourth transistor is of said conductivity type and has its collector and emitter electrodes connected to said third circuit point and to said third transistor base electrode, respectively.

* * * * *